United States Patent
Yoshida

(10) Patent No.: US 7,671,133 B2
(45) Date of Patent: Mar. 2, 2010

(54) VULCANIZED FLUORINE RUBBER AND CUSHIONING MATERIAL FOR HEAT PRESS CONTAINING SAME

(75) Inventor: Akira Yoshida, Kanuma (JP)

(73) Assignee: Yamauchi Corporation, Osaka (JP)

( * ) Notice: Subject to any disclaimer, the term of this patent is extended or adjusted under 35 U.S.C. 154(b) by 1117 days.

(21) Appl. No.: 10/560,189

(22) PCT Filed: May 20, 2004

(86) PCT No.: PCT/JP2004/006843

§ 371 (c)(1),
(2), (4) Date: Dec. 9, 2005

(87) PCT Pub. No.: WO2004/108819

PCT Pub. Date: Dec. 16, 2004

(65) Prior Publication Data

US 2007/0027259 A1    Feb. 1, 2007

(30) Foreign Application Priority Data

Jun. 9, 2003 (JP) .............................. 2003-164179

(51) Int. Cl.
C08L 27/12 (2006.01)
(52) U.S. Cl. .................... 525/197; 156/307.3; 428/421; 428/463; 428/492; 524/500
(58) Field of Classification Search ................ 525/197; 524/500; 156/307.3; 428/421, 463, 492
See application file for complete search history.

(56) References Cited

U.S. PATENT DOCUMENTS

| 4,394,205 | A | * | 7/1983 | Blenner | 156/307.3 |
| 5,446,081 | A | * | 8/1995 | Sonoi | 524/251 |
| 6,391,460 | B1 | * | 5/2002 | Tanaka et al. | 428/421 |
| 7,018,705 | B2 | * | 3/2006 | Nakatani et al. | 428/209 |
| 2003/0059576 | A1 | | 3/2003 | Halterbeck et al. | |

FOREIGN PATENT DOCUMENTS

| DE | 1636307 | | 7/1970 |
| EP | 0703069 | | 3/1996 |
| EP | 1433583 | | 6/2004 |
| EP | 04734098 | | 6/2007 |
| JP | 04-268357 | * | 9/1992 |
| JP | 4268357 | | 9/1992 |

(Continued)

OTHER PUBLICATIONS

Examination Report, Aug. 29, 2006.

*Primary Examiner*—Peter D. Mulcahy
*Assistant Examiner*—Henry Hu
(74) *Attorney, Agent, or Firm*—Ditthavong Mori & Steiner, P.C.

(57) ABSTRACT

A vulcanized fluoro rubber is provided by vulcanizing a composition comprising 100 parts by mass of mixture in which a raw fluoro rubber (A) in which appropriate amount of vulcanizing agent has been previously compounded and a raw fluoro rubber (B) in which the vulcanizing agent is not compounded are mixed at a rate of 8/2 to 3/7, 1 to 10 parts by mass of an acid acceptor and 0 to 5 parts by mass of another compounding agent which is compounded as needed. Number average molecular weight of each of the raw fluoro rubber (A) and the raw fluoro rubber (B) is $3.5 \times 10^4$ to $2.0 \times 10^5$.

5 Claims, 2 Drawing Sheets

FOREIGN PATENT DOCUMENTS

| | | | |
|---|---|---|---|
| JP | 06-116464 | * | 4/1994 |
| JP | 6306180 A | | 11/1994 |
| JP | 07-026052 | * | 1/1995 |
| JP | 7026052 | | 1/1995 |
| JP | 07-053821 | * | 2/1995 |
| JP | 7053821 | | 2/1995 |
| JP | 6116464 | | 8/1995 |
| JP | 8259703 | | 10/1996 |
| JP | 10158458 | | 6/1998 |
| JP | 2000-052369 | * | 2/2000 |
| JP | 2001-192482 | * | 7/2001 |
| JP | 2001192482 A | | 7/2001 |
| JP | 2000052369 | | 5/2002 |
| JP | 2002144484 | | 5/2002 |
| WO | WO-2004/108819 A1 | * | 12/2004 |

* cited by examiner

VULCANIZED FLUORINE RUBBER AND CUSHIONING MATERIAL FOR HEAT PRESS CONTAINING SAME

TECHNICAL FIELD

The present invention relates to a vulcanized fluoro rubber which is suitable for being used under the condition of high temperature and high pressure and has low hardness. In addition, the present invention relates to a hot-press cushion material provided with the above vulcanized fluoro rubber.

BACKGROUND ART

Hot pressing is performed when an object product is formed or compression bonded in a process of manufacturing a precision equipment component having a laminated structure (referred to as the laminated board hereinafter) such as a printed circuit board such as a copper-clad laminated board, a flexible printed circuit board (FPC) and a multi-layer laminated board, an IC card, a ceramics laminated board, a liquid crystal display panel and the like.

According to the hot pressing, as shown in FIG. 4, a method in which laminated board material 17 which is an object to be pressed is interposed between hot platens 18 and a constant pressure and heat are applied thereto is used in general. In order to provide a laminated board with high precision, it is necessary to apply the heat and the pressure to the laminated board material 17 uniformly over an entire surface thereof. Thus, the hot pressing is performed using a cushion material 1 in the shape of flat plate interposed between the hot platen 18 and the laminated board material 17.

When the laminated board material 17 has fine irregularities of circuits on a surface such as an FPC or a multilayer board, or has relatively large irregularities such as a flex-build board which has a structure of integrated FPC and multilayer board, it is necessary for the cushion material 1 to follow the irregularities of the laminated board material 17 sufficiently. If the cushion material 1 does not sufficiently follow up the irregularities of the laminated board material 17, the heat and pressure cannot be uniformly applied to the entire surface of the laminated board material 17. As a result, a bonding defect is generated or air bubbles remain in the laminated board.

Japanese Unexamined Patent Publication No. 2000-52369 (patent document 1) discloses a hot-press cushion material in which fluoro rubber having high heat resistance and high durability is used. Particularly, a hot-press cushion material using a fluoro rubber having durometer hardness A60 is disclosed in the document in order to follow up the irregularities of the object to be pressed. However, since the printed circuit has become increasingly fine recently, the cushion material using the conventional fluoro rubber does not sufficiently follow up the irregularities. Therefore, in order to further improve following characteristics to the irregularities, the fluoro rubber having lower hardness has been required. However, the fluoro rubber has original characteristics in which it is not likely to be softened. When a method of lowering the hardness by compounding a lot of softener or plasticizer in the fluoro rubber is used, gas or bleeding is generated from the fluoro rubber at the time of the hot pressing. As a result, the pressing apparatus or the laminated board is contaminated, which causes a serious defect. Therefore, a low-molecular material such as the softener or plasticizer is not to be used as much as possible.

Meanwhile, as a method of lowering the hardness of the fluoro rubber, while preventing bleeding of the plasticizer, a method of compounding a liquid rubber such as a liquid fluoro rubber and the like in the fluoro rubber composition instead of the plasticizer is well-known in Japanese Unexamined Patent Publication No. 10-158458 (patent document 2), Japanese Unexamined Patent Publication No. 7-53821 (patent document 3) and Japanese Unexamined Patent Publication No. 6-116464 (patent document 4). However, in a case of the application of hot-press cushion material, the fluoro rubber compounding the liquid rubber is not preferable because it is expected that the liquid rubber bleeds at high temperature under high pressure.

In addition, a vulcanized fluoro rubber composition having low hardness of A50 or less is disclosed in Japanese Unexamined Patent Publication No. 4-268357 (patent document 5). However, since a raw fluoro rubber disclosed in the patent document 5 is characterized by intrinsic viscosity and molecular weight distribution, it can be provided only by particular synthesis composition. As a result, it is difficult to obtain it from a commercially available raw fluoro rubber, so that a manufacturer who forms or processes the rubber products cannot easily implement it.

Thus, it is very hard to provide the vulcanized fluoro rubber which is suitable for being used as the hot-press cushion material and has durometer hardness lower than A60.

DISCLOSURE OF INVENTION

It is an object of the present invention to provide a vulcanized fluoro rubber which has low hardness and does not generate bleeding under the condition of high temperature and high pressure and easy to be available.

It is another object of the present invention to provide a hot-press cushion material which is superior in following irregularities of an object to be pressed and does not generate bleeding when it is used.

The inventors of the present invention tried to lower the hardness of the vulcanized fluoro rubber by reducing the degree of vulcanization of the fluoro rubber instead of compounding a lot of low-molecular material such as the softener or plasticizer. However, when the fluoro rubber composition was composed so that the degree of vulcanization was lowered, although the hardness of the vulcanized fluoro rubber was lowered, bleeding was generated sometimes when the vulcanized fluoro rubber was put under the condition of high temperature and high pressure. It was found that the exdation material was a fluoro rubber element from analysis of the bleeding. As a result of further study, it was found that the object of the present invention could be attained by using a fluoro rubber having relatively large number average molecular weight and composing the fluoro rubber composition so as to reduce the degree of vulcanization.

A vulcanized fluoro rubber according to the present invention is provided by vulcanizing a composition comprising 100 parts by mass of mixture in which a raw fluoro rubber (A) in which appropriate amount of vulcanizing agent has been previously compounded and a raw fluoro rubber (B) in which the vulcanizing agent is not compounded are mixed at a rate of 8/2 to 3/7, 1 to 10 parts by mass of an acid acceptor and 0 to 5 parts by mass of another compounding agent which is compounded as needed, in which number average molecular weight of each of the raw fluoro rubber (A) and the raw fluoro rubber (B) is $3.5 \times 10^4$ to $2.0 \times 10^5$.

When the raw fluoro rubber (A) in which the appropriate amount of vulcanizing agent has been previously compounded and the raw fluoro rubber (B) in which the vulcanizing agent is not compounded are mixed at a rate of 8/2 to 3/7, the degree of vulcanization is reduced. When the mixture ratio of (A)/(B) is more than 8/2, it is very difficult to obtain the vulcanized fluoro rubber having the low hardness, which is an object of the present invention. Meanwhile, when the mixture ratio of (A)/(B) is less than 3/7, the strength of the fluoro rubber is low and the compression set is increased and then the durability deteriorates. The mixture ratio of the (A)/(B) is preferably 7/3 to 3/7.

Although the kind of the fluoro rubber is not particularly limited, vinylidene fluoride (VDF) copolymer is preferable because it is superior in characteristics of the compression set when used in the hot pressing. In addition, according to a vulcanization system of the fluoro rubber, the fluoro rubber of polyol vulcanization system which is superior in characteristics of the compression set and which is not likely to be physically changed at high temperature is preferable.

The raw fluoro rubber of the vinylidene fluoride (VDF) copolymer and the polyol vulcanization system is commercially available as "DAI-EL"(DAIKIN INDUSTRIES, LTD), "Viton" (Du Pont Company), "Fluorel" (3M), "Technoflon" (Ausimont Inc.) and the like.

Both of are a raw fluoro rubber in which an appropriate amount of vulcanizing agent is previously mixed and a raw fluoro rubber in which no vulcanizing agent is mixed are commercially available. Therefore, the commercially available raw fluoro rubbers in which the vulcanizing agent is mixed and the raw fluoro rubber in which no vulcanizing agent is mixed may be used. The composition ratio of the vulcanizing agent can be lower than the normal ratio by appropriately blending the two raw fluoro rubbers, so that there can be provided the vulcanized fluoro rubber having a low degree of vulcanization.

Since the fluoro rubber composition of the present invention is compounded so that the degree of vulcanization may be low and the compounding agent such as the filler and the like which increases the hardness of the vulcanized fluoro rubber is reduced as much as possible, there can be provided the vulcanized fluoro rubber having low hardness.

Meanwhile, unvulcanized fluoro rubber component exists in a vulcanized fluoro rubber having the low degree of vulcanization, but since the fluoro rubber having the relatively high number average molecular weight is used in the present invention, bleeding is prevented from being generated when it is used under the condition of high temperature and high pressure.

The reason why the number average molecular weight of the raw fluoro rubber is not less than $3.5 \times 10^4$ is that if a fluoro rubber having number average molecular weight lower than this value is used, when the vulcanized fluoro rubber is used under the condition of high temperature and high pressure, an unvulcanized fluoro rubber component could bleed. Meanwhile, when the number average molecular weight is more than $2.0 \times 10^5$, viscosity of the rubber before vulcanization is increased, so that processability could deteriorate.

From another point of view, a vulcanized fluoro rubber according to the present invention is provided by vulcanizing a composition comprising 100 parts by mass of mixture of a raw fluoro rubber having number average molecular weight $3.5 \times 10^4$ to $2.0 \times 10^5$ and a vulcanizing agent, 1 to 10 parts by mass of an acid acceptor and 0 to 5 parts by mass of another composing agent which is compounded as needed in which a degree of vulcanization is expressed by a gel fraction 90.0% to 98.8%.

In this case also, since the compounding agent such as the filler which raise the hardness of the vulcanized fluoro rubber is reduced as much as possible and the degree of vulcanization is lowered, there can be provided the vulcanized fluoro rubber having low hardness. In addition, since the fluoro rubber having relatively high number average molecular weight is used, bleeding is not generated even when it is used under the condition of high temperature and high pressure.

The degree of vulcanization is adjusted as will be described below. That is, when the raw fluoro rubber including the vulcanizing agent and the raw fluoro rubber including no vulcanizing agent are blended and their blending ratio is changed, the degree of vulcanization can be adjusted so as to be 90.0% to 98.8% of the gel fraction. Alternatively, the degree of vulcanization can be 90.0% to 98.8% of the gel fraction also by compounding a smaller amount of the vulcanizing agent than a normal amount in the raw fluoro rubber having no vulcanizing agent, instead of using the raw fluoro rubber including the vulcanizing agent.

In the case where the vulcanizing agent is compounded in the raw fluoro rubber having no vulcanizing agent, a well-known vulcanizing agent such as bisphenol can be used, and vulcanization accelerator such as ammonium salt or phosphonium salt is preferably used together. If the gel fraction of the vulcanized fluoro rubber is less than 90.0%, the strength as a rubber is small and the compression set is increased. As a result, its durability deteriorates. Meanwhile, if the gel fraction is more than 98.8%, it is very difficult to obtain the vulcanized fluoro rubber having the low hardness, which is the object of the present invention. Thus, a lower limit value of the gel fraction is more preferably 95.0% and an upper limit value thereof is more preferably 98.7%. In addition, according to the present invention, the gel fraction is a remaining gel fraction after extracted using methyl ethyl ketone as a solvent.

The acid acceptor is compounded in the fluoro rubber composition according to the present invention as an essential component, besides the fluoro rubber and the vulcanizing agent. The acid acceptor is the essential component in order to neutralize hydrogen fluoride which is generated in the process of vulcanization of the raw fluoro rubber. As the acid acceptor, generally used metal oxide or salt, more particularly, magnesium oxide, calcium oxide, magnesium hydroxide, calcium hydroxide, zinc oxide, dibasic lead phosphate and the like can be used.

According to the compounding ratio of the acid acceptor, 1 to 10 parts by mass of the acid acceptor is compounded in 100 parts by mass of the mixture of the fluoro rubber and the vulcanizing agent. If the compounding ratio is more than 10 parts by mass, it becomes difficult to attain the low hardness of the vulcanized fluoro rubber. More preferably, 1 to 5 parts by mass of the acid acceptor is compounded in 100 parts by mass of the mixture of the fluoro rubber and the vulcanizing agent.

In addition, an optional component of the filler, the plasticizer, a coloring agent and the like can be selectively compounded in a range of 0 to 5 parts by mass in total. This optional agents are not compounded at all in some cases. Since this optional agents could prevent the vulcanized fluoro rubber from being softened or cause generation of gas or bleeding when the vulcanized fluoro rubber is used, it is necessary to limit it until 5 parts by mass in total in the present invention. Preferably, the optional components is 0 to 3 parts by mass in total and more preferably, it is 0 to 1.5 parts by mass in total.

When the plasticizer is compounded, in order to prevent the plasticizer from bleeding when the vulcanized fluoro rubber is used, the plasticizer is preferably volatilized by secondary vulcanizing the vulcanized fluoro rubber at a temperature which is not less than a boiling point of the plasticizer. In this point of view, the plasticizer having a relatively low boiling point, more particularly, having a boiling point 250° C. or lower is preferably selected. The secondary vulcanization is preferably performed at 200° C. to 260° C. Although the secondary vulcanization is performed in order to improve the properties of the fluoro rubber in general, by setting the kind of plasticizer and secondary vulcanization temperature as described above, the effect that the plasticizer is prevented from bleeding when the vulcanized fluoro rubber is used can be provided, besides the general effect of the secondary vulcanization.

According to the vulcanized fluoro rubber of the present invention, its durometer hardness is preferably A40 to A55. If the durometer hardness of the vulcanized fluoro rubber is less than A40, it is difficult to maintain the properties such as the strength, the compression set, the durability and the like as the rubber. Meanwhile, the durometer hardness of the vulcanized fluoro rubber is more than A55, there cannot be provided the vulcanized fluoro rubber having the low harness, and the hot-press cushion material which is superior in following up the irregularities of the object to be pressed, although those are intended in the present invention. An upper limit value of the durometer hardness of the vulcanized fluoro rubber is preferably A54. A lower limit value of the durometer hardness of the vulcanized fluoro rubber is preferably A45.

The vulcanized fluoro rubber according to the present invention is preferably has a small compression set under the condition of high temperature and high pressure. More specifically, the compression set is preferably 30% or less under the condition that a temperature is 200° C., a compression rate is 25%, and a time is 24 hours. If the compression set is too high, when the vulcanized fluoro rubber is used as the hot-press cushion material, the irregularities of the circuit and the like are transferred to the vulcanized fluoro rubber after pressed and heat and pressure cannot be uniformly applied at the next pressing, so that quality of the pressed object is adversely affected. In addition, when the vulcanized fluoro rubber is extended in the planar direction by the pressure at the time of pressing, the rubber could be broken.

A hot-press cushion material according to the present invention is characterized by comprising the above vulcanized fluoro rubber. The hot-press cushion material having such constitution is superior in following the irregularities of the pressed object and prevents bleeding when it is used.

The hot-press cushion material is provided by forming the fluoro rubber composition into the shape of sheet and vulcanizing it. The hot-press cushion material may be used as a single vulcanized fluoro rubber sheet or may be used together with other materials.

From viewpoints of durability and dimensional stability, it is more preferable that the hot-press cushion material is constituted such that the vulcanized fluoro rubber layer and a reinforcing layer are laminated to be integrated than that it is used as the single vulcanized fluoro rubber sheet. In the case where the vulcanized fluoro rubber sheet and the reinforcing layer are laminated and integrated, the reinforcing material may be buried in the vulcanized fluoro rubber sheet or the reinforcing layer may be laminated on a surface of the vulcanized fluoro rubber layer. The reinforcing material is preferably a woven fabric of heat-resistant fiber such as glass, polyamide, aromatic polyamide and the like or a metal board.

In addition, when the hot-press cushion material is constituted such that the vulcanized fluoro rubber sheet and another material are combined, one or more vulcanized fluoro rubber layers and one or more layers selected from a woven fabric, a non-woven fabric, a paper, a film, a foil, a sheet may be laminated to be integrated.

The hot-press cushion material preferably has at least one surface which is formed of the vulcanized fluoro rubber sheet of the present invention so that the irregularities of the pressed object can be well followed up.

In addition, a release treatment may be performed on a surface of the vulcanized fluoro rubber sheet to provide the surface of the hot-press cushion material within a range in which surface characteristics of the vulcanized fluoro rubber is not disturbed. As the release treatment, there are attachment of a synthetic resin film, coating of a synthetic resin, roughing a rubber surface, irradiation with ultraviolet ray or electron ray and the like. When the synthetic resin is attached as the release treatment, for the reason that the surface characteristics of the vulcanized fluoro rubber is not disturbed, a thickness of the synthetic resin film is preferably 10 μm to 100 μm.

In the hot-press cushion material according to the present invention, a thickness of the vulcanized fluoro rubber sheet or the vulcanized fluoro rubber layer is preferably 0.1 mm to 5.0 mm. If the thickness of the vulcanized fluoro rubber sheet or the vulcanized fluoro rubber layer is less than 0.1 mm, the irregularities of the laminated board of the pressed object are not sufficiently followed up. As a result, the quality of the laminated board could be adversely affected. Meanwhile, the thickness of the vulcanized fluoro rubber sheet or the vulcanized fluoro rubber layer is more than 5.0 mm, dimensional stability and durability of the hot-press cushion material deteriorate, and heat insulating property of the hot-press cushion material is increased too much, so that heat is not sufficiently applied to the pressed object. As a result, the quality of the laminated board deteriorates also.

BEST MODE FOR CARRYING OUT THE INVENTION

Hereinafter, embodiments of the present invention will be described.

FIG. 1(a) to 1(l) show concrete constitution examples of hot-press cushion materials 1 according to the present invention.

Figure 1:
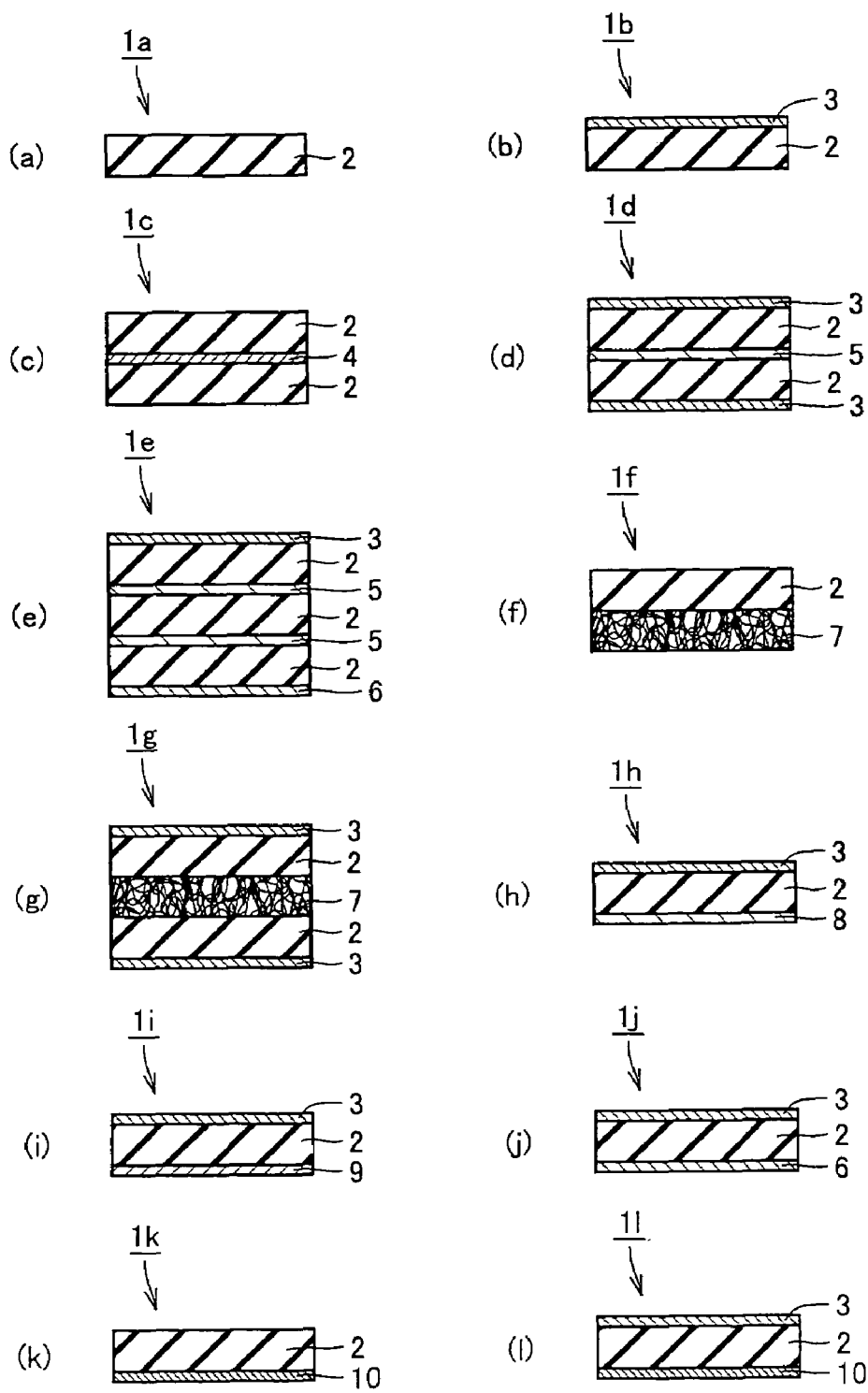
FIG. 1(a) to 1(l) are views showing concrete constitutions of hot-press cushion materials according to the present invention.

A hot-press cushion material 1a shown in FIG. 1(a) comprises a single sheet-shaped fluoro rubber 2.

According to a hot-press cushion material 1b shown in FIG. 1(b), a fluoro resin film 3 is bonded onto a surface of a vulcanized fluoro rubber layer 2 as a release treatment. The vulcanized fluoro rubber 2 and the fluoro resin film 3 are preferably bonded by pressing vulcanization of the vulcanized fluoro rubber 2 without using an adhesive agent. When the adhesive agent is used between the vulcanized fluoro rubber 2 and the fluoro resin film 3, rubber properties on a surface of the hot-press cushion material 1b are disturbed by the adhesive agent, which adversely affects property which follows irregularities of an object to be pressed and buffering property of heat and pressure.

According to a hot-press cushion material 1c shown in FIG. 1(c), two vulcanized fluoro rubber layers 2 are laminated with an aromatic polyamide cloth 4 provided as a reinforcing layer between them so as to be integrated.

According to a hot-press cushion material 1d shown in FIG. 1(d), two vulcanized fluoro rubber layers 2 are laminated with a glass cloth 5 provided as a reinforcing layer between them, and a fluoro resin film 3 is bonded on both upper and lower surfaces of the fluoro rubber layer 2.

According to a hot-press cushion material 1e shown in FIG. 1(e), glass cloths 5 are provided between three vulcanized fluoro rubber layers 2, and a fluoro resin film 3 is laminated on an upper surface of the vulcanized fluoro rubber layer 2 and a glass cloth 6 is laminated on a lower surface of the vulcanized fluoro rubber layer 2 so as to be bonded and integrated. The glass cloth 6 is coated with a polyimide resin to provide a release property on a surface which side is not bonded to the vulcanized fluoro rubber layer 2.

According to a hot-press cushion material 1f shown in FIG. 1(f), an aromatic polyamide non-woven fabric 7 and a vulcanized fluoro rubber 2 are laminated so as to be integrated.

According to a hot-press cushion material 1g shown in FIG. 1(g), an aromatic polyamide non-woven fabric layer 7 is provided between two vulcanized fluoro rubber layers 2 and a fluoro resin film 3 is laminated on both upper and lower surfaces of the two fluoro rubber layers 2 so as to be integrated.

According to a hot-press cushion material 1h shown in FIG. 1(h), a fluoro resin film 3 is laminated on an upper surface of a vulcanized fluoro rubber layer 2 and a polyimide film 8 is laminated on a lower surface thereof to be bonded and integrated.

According to a hot-press cushion material 1i shown in FIG. 1(i), a fluoro resin film 3 is laminated on an upper surface of a vulcanized fluoro rubber layer 2 and a glass cloth 9 is laminated on a lower surface thereof to be bonded and integrated. The glass cloth 9 is coated with a fluoro resin on a surface which side is not bonded to the vulcanized fluoro rubber layer 2 to provide a release property.

According to a hot-press cushion material 1j shown in FIG. 1(j), a fluoro resin film 3 is laminated on an upper surface of a vulcanized fluoro rubber layer 2 and a glass cloth 6 having a surface which side is not bonded to the vulcanized fluoro rubber layer 2 and coated with a polyimide resin to provide a release property is laminated on a lower surface thereof so as to be bonded and integrated.

According to a hot-press cushion material 1k shown in FIG. 1(k), an aluminum board 10 and a vulcanized fluoro rubber 2 are laminated and integrated.

According to a hot-press cushion material 1l shown in FIG. 1(l), a fluoro resin film 3 is laminated on an upper surface of a vulcanized fluoro rubber layer 2 and an aluminum board 10 is laminated on a lower surface thereof to be integrated.

Figure 4:
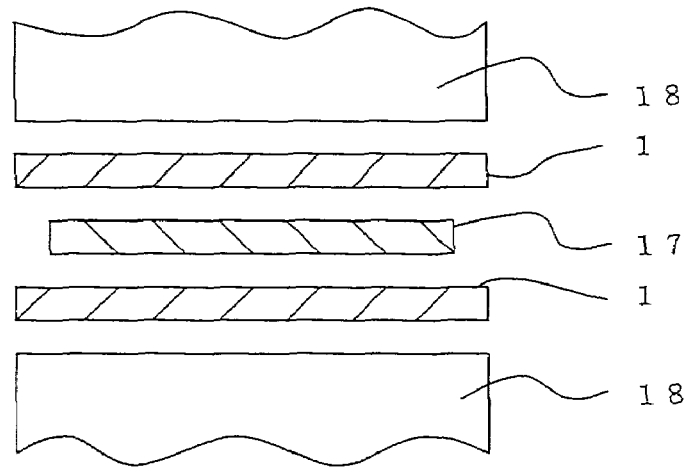
FIG. 4 is a view for explaining hot pressing.

Next, a description will be made of a method of manufacturing a laminated board using the hot-press cushion material 1. FIG. 4 is a view showing a typical example of hot pressing when the laminated board is manufactured. That is, heat and pressure are applied in a state in which the cushion material 1 is interposed between a platen 18 and a laminated board material 17 which is an object to be pressed, so that the laminated board material 17 is thermally pressed. The pressing condition is such that temperature is 100° C. to 250° C., pressure is 0.5 MPa to 7.0 MPa, and a pressing time is 1 minute to 120 minutes. In addition, although the laminated board material 17 after pressed is replaced with another one, since the cushion material 1 has durability, one cushion material is used over 50 to 2000 times of pressing in general without being exchanged.

Although the embodiments of the hot-press cushion material using vulcanized fluoro rubber according to the present invention were described in FIG. 1(a) to 1(l), the fluoro rubber according to the present invention can be used for another application if the application requires that low hardness is provided and bleeding is not generated even at high temperature and under high pressure.

[Working Example]

In order to confirm the effect of the present invention, the following comparative experiment was performed.

[Vulcanized Fluoro Rubber]

Unvulcanized fluoro rubber sheets were made by kneading fluoro rubber compositions of samples 1 to 8 consisting of components shown in a table 1 using two roll mill. Then, each unvulcanized fluoro rubber sheet was put in a mold, and primary vulcanization was performed by a pressing machine at 170° C. for 30 minutes. Then, the vulcanized fluoro rubber sheet was put in an oven and secondary vulcanization was performed at 230° C. for 24 hours. A gel fraction, durometer hardness, and compression set (200° C.×24 hours×25%) of each provided fluoro rubber sheet are shown together in the table 1.

TABLE 1

| | | | | | | | | | (Parts by mass) | |
|---|---|---|---|---|---|---|---|---|---|---|
| | | Sample 1 | Sample 2 | Sample 3 | Sample 4 | Sample 5 | Sample 6 | Sample 7 | Sample 8 |
| Fluoro rubber A | (1) | — | 100 | 100 | 80 | 70 | 50 | 30 | 20 |
| Fluoro rubber B | (2) | — | — | — | 20 | 30 | 50 | 70 | 80 |
| Fluoro rubber C | (3) | 50 | — | — | — | — | — | — | — |
| Fluoro rubber D | (4) | 50 | — | — | — | — | — | — | — |
| Filler | (5) | — | 15 | — | — | — | — | — | — |
| Acid acceptor | (6) | 1.5 | 7 | 1.5 | 1.5 | 1.5 | 1.5 | 1.5 | 1.5 |
| Vulcanizing accelerator | (7) | 3 | 4 | 3 | 3 | 3 | 3 | 3 | 3 |
| Pigment A | (8) | 0.5 | — | 0.5 | 0.5 | 0.5 | 0.5 | 0.5 | 0.5 |
| Pigment B | (9) | — | 4.6 | — | — | — | — | — | — |
| Coupling agent | (10) | 0.25 | 0.25 | 0.25 | 0.25 | 0.25 | 0.25 | 0.25 | 0.25 |
| Plasticizer | (11) | 0.5 | 1 | 0.5 | 0.5 | 0.5 | 0.5 | 0.5 | 0.5 |
| Gel fraction[%] | | 93.0 | 99.3 | 98.9 | 98.8 | 98.7 | 98.2 | 95.7 | 88.2 |
| Hardness(A) | | 49 | 62 | 56 | 55 | 52 | 50 | 49 | 47 |
| Compression set[%] | | 22.6 | 9.6 | 11.5 | 14.0 | 14.1 | 16.4 | 25.3 | 60.9 |

TABLE 2

| | | | | | |
|---|---|---|---|---|---|
| (1) | G701 | DAIKIN INDUSTRIES, LTD. | PDF-HFP copolymer | Polyol vulcanizing agent is contained | Number average molecular weight $4.1 \times 10^4$ |
| (2) | G701BP | DAIKIN INDUSTRIES, LTD. | PDF-HFP copolymer | No vulcanizing agent is contained | Number average molecular weight $4.1 \times 10^4$ |
| (3) | G755C | DAIKIN INDUSTRIES, LTD. | PDF-HFP copolymer | Polyol vulcanizing agent is contained | Number average molecular weight $3.4 \times 10^4$ |
| (4) | G755CBP | DAIKIN INDUSTRIES, LTD. | PDF-HFP copolymer | No vulcanizing agent is contained | Number average molecular weight $3.4 \times 10^4$ |
| (5) | PYROKISUMA 5301 | Kyowa Chemical Industry Co., Ltd. | Low-active MgO | | |
| (6) | MICROMAG 3-150 | Kyowa Chemical Industry Co., Ltd. | High-active MgO | | |
| (7) | CALDIC #2000 | Ohmi Chemical Industry Co., Ltd | Ca(OH)2 | | |
| (8) | Pigmotex 701E | Sanyo Color Works, LTD. | | | |
| (9) | Red oxide | TODA Pigment CORP. | | | |
| (10) | PLENACT KR-TTS | Ajinomoto-Fine-Techno Co., Inc. | | | |
| (11) | SANSOCIZER DOA | New Japan Chemical Co., Ltd. | DOA | Boiling point 215° C. | |

A table 2 shows concrete examples of the fluoro rubber A(1) to the plasticizer (11) shown in the table 1.

The gel fraction was measured as will be described below. That is, the vulcanized fluoro rubber sheet about 1 mm square was cut and about 2 g of the cut sample was extracted by Soxhlet extraction apparatus using methyl ethyl ketone (99%) as a solvent for 4 hours. After extraction, gel was dried in the atmosphere for 16 hours and then left in a thermostatic chamber of 70° C. for 2 days to volatilize the solvent. The gel fraction was found as follows from a weight ratio between before and after extraction.

Gel fraction (%)=(weight after extraction/weight before extraction)×100

[Hot-press Cushion Material]

Figure 2:
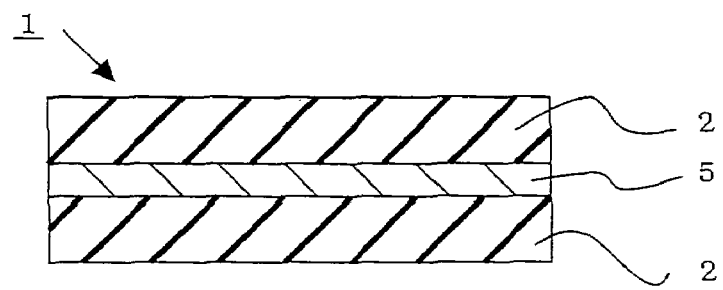
FIG. 2 is a sectional view showing a hot-press cushion material in an embodiment and comparative example according to the present invention.

Hot-press cushion materials 1 of the samples 1 to 8 were made by the following procedures, using the fluoro rubber compositions shown in the table 1. As shown in FIG. 2, each hot-press cushion material 1 has a constitution in which a glass cloth 5 is interposed between two vulcanized fluoro rubber layers 2 as a reinforcing layer and they are laminated and integrated. First, the fluoro rubber composition was kneaded using two roll mill and two sheets of unvulcanized fluoro rubber having a thickness 0.5 mm was made. Then, a plain-woven glass cloth having a thickness 0.2 mm is interposed between the two unvulcanized fluoro rubber sheets to be laminated, and the laminateds were integrated by primary vulcanization of the fluoro rubber and by pressing at 180° C. under 0.98 MPa for 60 minutes. Then, the secondary vulcanization was performed in an oven at 230° C. for 24 hours, and thus, the hot-press cushion material 1 was provided.

Figure 3:
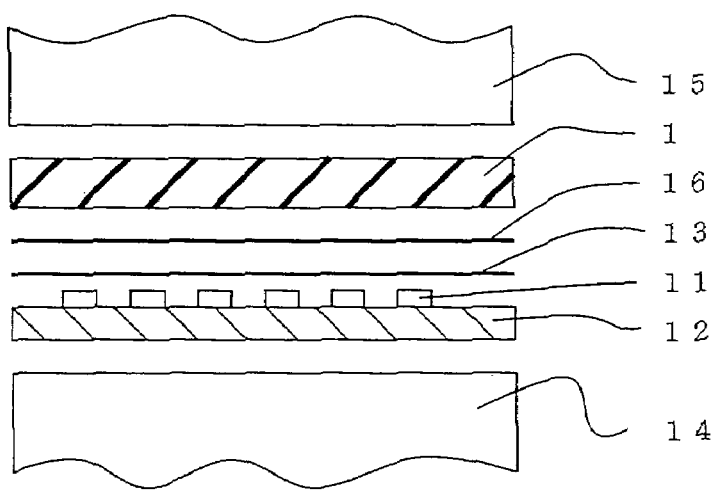
FIG. 3 is a view for explaining a hot pressing apparatus used in evaluating performance of the hot-press cushion material.

Using each hot-press cushion material 1, a board 12 having a thickness 50 μm on which a circuit 11 having a width 50 μm, pitch 50 μm and thickness 50 μm is printed, and a polyimide cover lay film 13 having a thickness 25 μm and an adhesive agent applied on a side of the board 12 are compression bonded to provide a flexible printed circuit board as shown in FIG. 3. Laminated materials comprising the board 12, the cover lay film 13, a fluoro resin release film 16 having a thickness 25 μm, and the hot-press cushion material 1 which were laminated from beneath in this order was interposed between a lower hot platen 14 and an upper hot platen 15 and then hot pressing was performed at 200° C. under pressure 4.9 MPa for 3 minutes. After the pressing, the board 12 on which the cover lay film 13 was compression bonded and the release film 16 were exchanged an pressing process under the same condition was repeated 500 times, and the performance of the hot-press cushion material 1 was evaluated. The evaluated results are shown in a table 3.

TABLE 3

| | Sample 1 | Sample 2 | Sample 3 | Sample 4 | Sample 5 | Sample 6 | Sample 7 | Sample 8 |
|---|---|---|---|---|---|---|---|---|
| Durability | Good | Good | Good | Good | Good | Good | Good | No good |
| Pressing performance | Good | No good | No good | Possible | Good | Good | Good | No good |
| Bleeding | No good | Good | Good | Good | Good | Good | Good | Impossible to evaluate |
| Total evaluation | No good | No good | No good | Possible | Good | Good | Good | No good |

Durability

Observing the state of the hot-press cushion material 1 after the pressing processes were performed 500 times, the samples 1 to 7 were good. However, according to the sample 8 having a gel fraction 88.2%, the hot-press cushion material was damaged.

Pressing Performance

Observing bonding state between the board 12 and the cover lay film 13, the samples 1, and 5 to 7 were good. According to the sample 4 having a gel fraction 98.8%, although several voids were generated at recesses between the circuits 11, it was thought that it could be used for the board 12 having shallow irregularities. According to the samples 2 and 3 having gel fractions more than 98.8%, irregularities of the board 12 were not sufficiently followed and many voids were generated and there were some places which were not bonded at recesses between the circuits 11. According to the sample 8 having a gel fraction 88.2%, since the cushion material 1 was damaged, the heat compression bonding could not be performed.

Bleeding Evaluation

It was observed whether gas or bleeding was generated from contamination conditions of the hot platen 15, the flexible printed circuit board and the like.

According to the samples 2 to 7, gas or bleeding was not generated at all. According to the sample 1 having a number average molecular weight $3.4 \times 10^4$, the fluoro rubber component bled along the glass cloth. According to the sample 8 having a gel fraction 88.2%, since the hot-press cushion material was damaged, the measurement could not be performed.

Total Evaluation

It was confirmed that the objects of the present invention could be attained in the samples 5 to 7, from the above evaluations. According to the sample 4, although the irregularities are not sufficiently followed in the pressing performance, it can be used for the board 12 having shallow irregularities.

Although one embodiment of the present invention was described with reference to the drawings, the present invention is not limited to the above illustrated embodiment. Various modifications may be made within the same or equivalent scope of the present invention.

According to the vulcanized fluoro rubber of the present invention, it is constituted so as to decrease a degree of vulcanization, amounts of the compounding agent such as the filler which increases hardness of the vulcanized fluoro rubber, and the compounding agent such as the softener and the plasticizer which is likely to bleed are decreased as much as possible, and the fluoro rubber having relatively great number average molecular weight is used. As a result, by combining above conditions, there can be provided the vulcanized fluoro rubber which has low hardness and does not generate bleeding even used under the condition of high temperature and high pressure.

In addition, according to the hot-press cushion material of the present invention, since the above vulcanized fluoro rubber is used, the irregularities of the object to be pressed can be satisfactorily followed and bleeding is prevented from being generated.

INDUSTRIAL APPLICABILITY

The present invention is effectively applied to a vulcanized fluoro rubber which is used at high temperature under high pressure and a hot-press cushion material which is provided with such vulcanized fluoro rubber.

The invention claimed is:

1. A hot-press cushion material comprising:
    a vulcanized fluoro rubber provided by vulcanizing a composition comprising:
        100 parts by mass of mixture in which a raw fluoro rubber (A) in which a predetermined amount of vulcanizing agent has been previously compounded and a raw fluoro rubber (B) in which the vulcanizing agent is not compounded are mixed at a rate of 8/2 to 3/7, and
        1 to 10 parts by mass of an acid acceptor and 0 to 5 parts by mass of another compounding agent which is compounded as needed,
        wherein number average molecular weight of each of said raw fluoro rubber (A) and said raw fluoro rubber (B) is $3.5 \times 10^4$ to $2.0 \times 10^5$.

2. The hot-press cushion material according to claim 1, wherein a vulcanized fluoro rubber layer comprising said vulcanized fluoro rubber and a reinforcing layer are laminated to be integrated.

3. The hot-press cushion material according to claim 1, wherein one or more vulcanized fluoro rubber layers comprising said vulcanized fluoro rubber and one or more layers selected from a woven fabric, a non-woven fabric, a paper, a film, a foil, a sheet are laminated to be integrated.

4. The hot-press cushion material according to claim 1, wherein at least one surface is formed of said vulcanized fluoro rubber.

5. The hot-press cushion material according to claim 1, wherein a release treatment is performed on a surface of said vulcanized fluoro rubber.

* * * * *